(12) United States Patent
Theis et al.

(10) Patent No.: US 7,773,002 B2
(45) Date of Patent: Aug. 10, 2010

(54) METHOD AND APPARATUS FOR CHANNEL CODING AND DECODING

(75) Inventors: Oliver Theis, Hannover (DE); Friedrich Timmermann, Garbsen (DE)

(73) Assignee: Thomson Licensing, Boulogne-Billancourt (FR)

( * ) Notice: Subject to any disclaimer, the term of this patent is extended or adjusted under 35 U.S.C. 154(b) by 3 days.

(21) Appl. No.: 12/150,828

(22) Filed: May 1, 2008

(65) Prior Publication Data

US 2008/0272940 A1 Nov. 6, 2008

(30) Foreign Application Priority Data

May 3, 2007 (EP) ................... 07107441

(51) Int. Cl.
*H03M 7/00* (2006.01)

(52) U.S. Cl. .......................... 341/59; 341/50

(58) Field of Classification Search ............ 341/58, 341/59, 87, 67, 65, 50
See application file for complete search history.

(56) References Cited

U.S. PATENT DOCUMENTS

| | | | |
|---|---|---|---|
| 6,188,335 B1 * | 2/2001 | Roth et al. ............... | 341/59 |
| 6,366,623 B1 * | 4/2002 | Dupuy ................. | 375/340 |
| 6,369,724 B1 | 4/2002 | Nakagawa | |
| 7,158,060 B2 * | 1/2007 | Kahlman et al. .......... | 341/67 |
| 7,388,255 B2 * | 6/2008 | Nakano et al. ........... | 257/330 |
| 7,486,208 B2 * | 2/2009 | Cideciyan et al. ......... | 341/58 |
| 2003/0142757 A1 | 7/2003 | Kahlman | |

FOREIGN PATENT DOCUMENTS

| | | |
|---|---|---|
| EP | 0070387 | 1/1983 |
| GB | 2347599 | 9/2000 |
| WO | WO 00/03392 | 1/2000 |

OTHER PUBLICATIONS

Ligang Ke et al. "A New Construction For N-Track (d,k)) Codes With Redundancy" Information Theory, 1994 Proceedings 1994 IEEE International Symposium On Trondheim, Norway 27 Jun. 1 Jul. 1994, New York, NY USA IEEE Jun. 27, 1994, p. 145, XP010135281 ISBN: 0-7803-2015-8.
Maes J. et al. "Digital Audio Technology" Minidisc, SACD, DVD(A), MP3 And DAT, Oxford: F0CAL Press, GB, 2001, pp. 127-130, XP002321551 ISBN: O-240-5654-0.

* cited by examiner

*Primary Examiner*—Peguy JeanPierre
(74) *Attorney, Agent, or Firm*—Robert D. Shedd; Joseph J. Opalach; Jerome G. Schaefer

(57) ABSTRACT

In a channel encoder comprising a dk-encoder stage and a precoding stage, obeyance of a repeated minimum transition runlength constraint is achieved because, between the dk-encoder and the precoder, data are passed through an RMTR encoder which replaces occurrences of a forbidden pattern by a current replacement pattern having the same length as the forbidden pattern. By appropriately selecting current replacement patterns from a predefined set of two different replacement patterns, DC-control can be achieved for the encoder output. The corresponding decoder is described, which also employs pattern replacement.

These results are provided by a method of channel encoding binary data, wherein the data is contained in a n input sequence of data tuples. An input sequence of constrained tuples is generated that obeys the relationships heretorfore set forth. A post encoding step is applied with NRZI modulation to be used in a channel as described.

8 Claims, 3 Drawing Sheets

METHOD AND APPARATUS FOR CHANNEL CODING AND DECODING

FIELD OF THE INVENTION

This application claims the benefit, under 35 U.S.C. §119, of European Patent Application No. 07107441.3 filed May 3, 2007.

The present invention relates to channel coding and decoding sometimes also termed modulation and demodulation, in particular to Repeated Minimum Transition Runlength limited coding.

BACKGROUND

Storage as a transformation of signals in time can be modelled as a bandlimited channel, and for digital signal readout in particular, the bit clock is commonly regenerated from the read out signal. Both facts are reasons that Run-Length Limited or RLL channel codes are used on digital storage media. Known as (d,k) codes, they convert any sequence of arbitrary payload words into a sequence of channel words that has at least d and at most k "0"s between consecutive "1"s. In a subsequent transcoding or precoding stage, the sequence containing the thus isolated "1"s is converted to an output signal where each of the "1"s in the sequence causes a state change in the output signal. In digital optical storage, such state changes are from "pit" to "space" or vice versa, and in magnetical recording, they are from a "plus" to a "minus" magnetical orientation, or vice versa. This transcoding is known as NRZI coding; for mathematical tractability it is sometimes conceptually followed by a mapping of amplitudes to output values $x \in \{-1,+1\}$. Regardless of the physical basis of storage, the limitations on the distance of the "1"s in the sequence translate into the physically homogeneous regions between state changes on a storage track being of a length that is upper and lower limited.

FIG. 3 shows a block diagram of a prior art RLL-encoder having a dk-encoder 301 and a precoder 302. The dk-encoder 301 maps unconstrained data tuples u consisting of a predefined number of binary elements from {"0", "1"} to constrained tuples v of binary elements. In this, "unconstrained" means that any combination of element values may occur in the tuple; correspondingly, "constrained" refers to certain combinations of values being forbidden, as described herein. As a consequence of this constrainedness, it is unavoidable that the length or dimensionality of the constrained tuples v is bigger than the dimensionality of the data tuples u. As one typical example, data tuples of length 2 are dk-encoded into constrained tuples of length 3. The sequence of constrained tuples v fulfils or obeys a minimum runlength constraint d and a maximum runlength constraint k. The d-constraint requires at least d "zeros" between consecutive "ones", the k-constraint requires at most k "zeros" between any two consecutive "ones". The constrained tuples v are precoded with the NRZI approach in a precoder 302 into precoded tuples x which will be stored.

FIG. 4 shows a block diagram of a corresponding prior art RLL-decoder. A readout tuple x' is predecoded in a predecoder 402 into a dk-decodable tuple v', which in turn is dk-decoded in a dk-decoder 401 into the RLL decoded tuple u'. All through the following, terms like "dk-encoder", "dk-decoder" will be used without variation as a general way to denote the principle of runlength limited coding, whereas forms like "(d,k)" will be employed using the specific variables for the respectively pertaining lower and upper runlength limits.

In recent high density storage, it has been found as vital that codes additionally obey another constraint: It is forbidden (i.e. must not occur in the channel coded bitstream) that too many runs of the minimum allowed length d are immediately consecutive. This is known as a Repeated Minimum Transition Runlength or RMTR constraint, and if it is demanded for a channel, any channel encoding method or apparatus to be used for that channel must be such that this additional constraint is fulfilled.

RMTR constrained RLL channel codes are used in the recent high-density optical storage media, like blue laser disks. In prior art channel coding, fulfilling the RMTR constraint was often directly and empirically "built into" the channel coder or the code generation rule.

U.S. Pat. No. 4,413,251 describes a finite state machine (FSM) to convert unconstrained binary-valued sequences into a constrained binary-valued sequence in an invertible manner, and a finite lookahead state-independent decoder to be used therewith. Based on this, WO 00/03392 describes method and means for reducing high-duty-cycle unconstrained binary signal sequences in storage and communication. By heuristically modifying given RLL codes, binary sequences ordinarily mapping into high-duty-cycle RLL-code sequences are either inhibited from repeating indefinitely or excluded. The method and means described in WO 00/03392 can be seen to have the disadvantage that they employ an extended finite state machine (FSM) which is an indication of a more complex realization. Also, nothing is disclosed whether or how the findings can be generalized.

U.S. Pat. No. 6,369,724 describes apparatus and method for modulating and demodulating where an RMTR constraint is implemented by detecting in the coded data code sequences in which a minimum run is repeated, and subsequently converting them to a predetermined bit sequence. For the predetermined code sequence, different alternatives are described and rules for selection are given, but in any embodiment, a single such predetermined code sequence is always used.

SUMMARY OF THE INVENTION

The invention has recognized that with a code replacement scheme as disclosed in U.S. Pat. No. 6,369,724, it may be seen as a drawback that a predetermined single predetermined code sequence is always used. A replacement scheme allowing to select and apply one replacement pattern out of a set of several such patterns, would offer the advantage that characteristics of the resulting bitstream, like e.g. its running digital sum, can be influenced by the selection.

Same as in the prior art, fulfilling the RMTR limitation constraint is conceptually separated from the code design or the RLL coding, and is accomplished by a separate postencoding/predecoding step. Specifically, then, a conventional (d,k1) RLL limited code having an internal maximum runlength k1 smaller than the externally desired maximum runlength k is combined with a subsequent postencoding stage which eliminates forbidden Repeated Minimum Transition Runlengths. The result is a (d,k) RLL constrained coding additionally obeying an RMTL limitation. The associated decoder, correspondingly, has a predecoding stage performing the inverse operation of the postencoding stage, plus a subsequent (d,k1)-decoder.

With other words, the invention proposes a channel encoding method and apparatus, where a traditional (d,k1)-encoder or -encoding is combined with a separate postprocessing stage which achieves compliance with a RMTR constraint. The postprocessing does so by substituting those bit sequences also termed forbidden patterns, which would violate the RMTR constraint, by other bit sequences termed replacement patterns which are outside the internal maximum runlength limit k1 but within the limit k>k1. The invention enables that the postencoding step provides alternative replacement patterns to be used for replacing RMTR violating bit patterns. By appropriately choosing between the alternative replacement patterns, characteristics and properties of the resulting bitstreams, like the low frequency content of the output bitstream as described by the running digital sum RDS, can advantageously be influenced.

Advantageously, the code according to the invention can be designed to have an additional characteristic of prohibited runlengths, in which case certain runlengths larger than k1 and smaller than k will not occur within the output bitstream.

In an advantageous development of the invention, the prohibited runlengths are used to insert sync patterns without breaking the k constraint. With other words, the invention enables a new concept of synchronization patterns. It is known in prior art to insert, in regular intervals, into a (d,k) runlength coded data stream, sync patterns which deliberately violate the (d,k) runlength constraint of the data chunks inbetween. Specifically, sync patterns containing a runlength greater than the maximum allowable runlength of the RLL code are used. Codes generated by the invention, however, by exploiting the prohibited runlength characteristic they have, reserve a predetermined set of one or more runlengths from within the (d,k) range for synchronization purposes.

Correspondingly, a method according to the invention performs channel encoding of binary data contained in an input sequence of data tuples. Obeyance of a lower runlength limit, a second upper runlength limit, and a repeated minimum transition runlength constraint is achieved by encoding the input sequence into a sequence of constrained tuples using an RLL encoder having the lower runlength limit and a first upper runlength limit smaller than the second upper runlength limit, by generating from the sequence of constrained tuples a sequence of output tuples that obeys the repeated minimum transition runlength constraint by replacing any occurrences of a predefined forbidden pattern by a current replacement pattern having the same length as the forbidden pattern and being selected from a predefined set of two replacement patterns, and by postencoding with NRZI modulation the sequence of output tuples into a sequence of precoded tuples to be used in the channel.

Advantageously, in the method according to the invention, the forbidden pattern fp consists of $[0]^{(d+1)}[1][[0]^{(d)}[1]]^{r+1}$, and the predefined set of replacement patterns consists of a first replacement pattern rp1 consisting of $[0]^{(d+1)}[1][0]^{(k)}[1][0]^{(t)}[0]^{(d)}[1]$ and a second replacement pattern rp2 consisting of $[0]^{(d+1)}[1][0]^{(d)}[1][0]^{(k)}[1][0]^{(t)}$. In this and all through this application description, "0" and "1", respectively, designate a first and a second binary value of the binary data, the notation $[x]^{(y)}$ indicates a y-fold serial repetition of a binary value or string of binary values x, t is a predefined parameter obeying $$0 \leq 2t \leq (d+1) \cdot r - 1 - k1 \tag{1}$$

and r is the maximum allowable number of repetitions of the minimum runlength, i.e. the RMTR limitation.

Using these patterns has the advantage that the replacement patterns provide opposite polarity contributions to the Running Digital Sum of the NRZI modulated signal.

Advantageously, in the method according to the invention, a Running Digital Sum is calculated, for instance from the precoded bit sequence or from the RMTR coded sequence, and the selection of the current replacement pattern from the set of replacement patterns is done in such a way that the Running Digital Sum stays as close as possible near zero.

Another method according to the invention channel decodes binary data which obey a lower runlength limit, a second upper runlength limit, and a repeated minimum transition runlength constraint. Conversion into a reconstruction of the unconstrained payload data tuples is achieved by generating, from a sequence of readout tuples read out from a channel, a sequence of predecoded tuples by predecoding with NRZI demodulation; by generating from the sequence of predecoded tuples a sequence of dk decodable tuples by replacing, in an RMTR-decoder, any occurrences of a trigger pattern by a decoded pattern having the same length as the trigger pattern; and by dk-decoding the sequence of dk-decodable tuples into a sequence of RLL decoded tuples using a dk-decoder having the lower runlength limit and a first upper runlength limit smaller than the second upper runlength limit.

Advantageously, in this method, the trigger pattern consists of $[1][0]^{(k)}[1][0]^{(t)}$, and the decoded pattern consists of $[1][[0]^{(d)}[1]]^{(r+1)}$. This has the advantage, that a single trigger pattern allows to perform the inverse replacement, no matter which one of the replacement patterns has been used in the encoder side.

An apparatus according to the invention for channel encoding binary data has a dk-encoder with a lower runlength limit and a precoder performing NRZI modulation. For achieving obeyance of the lower runlength limit, a second upper runlength limit, and a repeated minimum transition runlength constraint, the dk-encoder in the apparatus has a first upper runlength limit smaller than the second upper runlength limit, and between the dk-encoder and the precoder, data are passed through an RMTR encoder performing replacement of forbidden patterns by one of two replacement patterns having the same length as the forbidden pattern.

An apparatus according to the invention for channel decoding binary data which obey a lower runlength limit, a second upper runlength limit, and a repeated minimum transition runlength constraint, has a predecoder for NRZI demodulation and a dk-decoder with the lower runlength limit. For conversion into a reconstruction of the unconstrained payload data tuples, data are passed, in between the predecoder and the dk-decoder, through an RMTR decoder which replaces any occurrences of a trigger pattern by a decoded pattern having the same length as the trigger pattern. The dk-decoder of the apparatus has a first upper runlength limit smaller than the second upper runlength limit.

BRIEF DESCRIPTION OF DRAWINGS

Exemplary embodiments of the invention are illustrated in the drawings and are explained in more detail in the following description.

In the Figures.

DETAILED DESCRIPTION OF EXEMPLARY EMBODIMENTS

Figure 3:
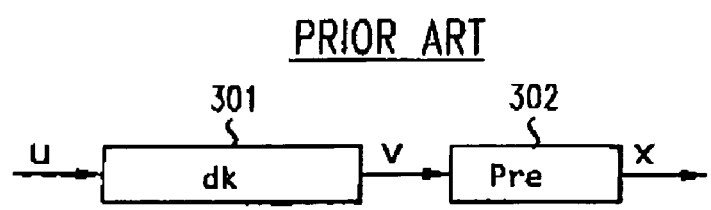
FIG. 3 shows a block diagram of a known RLL channel encoder.
Figure 4:
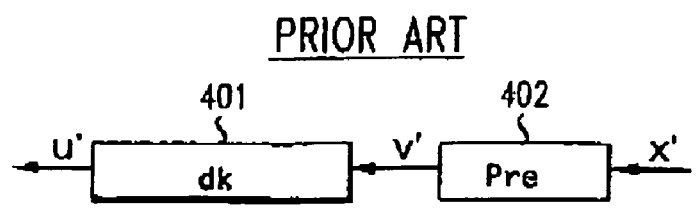
FIG. 4 shows a block diagram of a known RLL channel decoder.

In the prior art RLL-encoder shown in FIG. 3, the dk-encoder 301 does not take care of any RMTR limitation, so that any repetitive pattern of the form $$[0]^{(d+1)}[1]\,[[0]^{(d)}[1]]^{(\rho)}\,[0]^{(d+1)}$$

having a number $\rho$, $1 \leq \rho \leq \infty$ of repeated minimum runlengths might appear in the sequence of constrained tuples v. Among these patterns, the ones having $\rho > r$ are RMTR violating patterns which must be eliminated. In this, the notation "$[x]^{(y)}$" as defined above is used recursively and is generalized by defining that the special case of $[x]^{(0)}$ shall be interpreted as the empty string or bitstream, regardless of the value of x.

Figure 1:
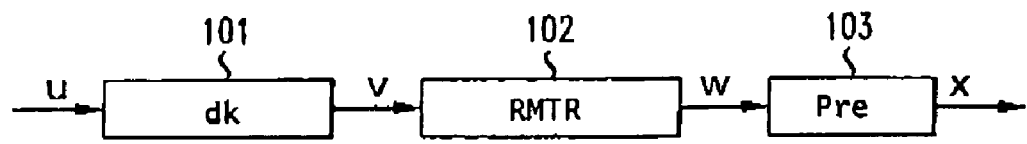
FIG. 1 shows a block diagram of a channel encoder according to the invention.

FIG. 1 shows a block diagram of an RMTR-obeying RLL-encoder according to the invention. The encoder has a conventional dk-encoder 101 obeying a runlength limitation of (d,k1), and a conventional precoder 103 for the NRZI modulation and mapping. According to the invention, an RMTR-encoder 102 is placed between the dk-encoder 101 and the precoder 103. From a sequence of data tuples u, the dk-encoder 101 generates a sequence of constrained tuples v by dk-encoding. From the sequence of constrained tuples v, and with an appropriately chosen design parameter $t \geq 0$ such that $k = (d+1)\cdot r - t - 1 > k1$, the RMTR-encoder 102 creates a sequence of RMTR encoded tuples w by replacing any forbidden pattern, i.e. where $\rho > r$ $$fp = [0]^{(d+1)}[1]\,[[0]^{(d)}[1]]^{(r+1)} \qquad (2)$$

within the sequence of constrained tuples v by a first replacement pattern $$rp1 = [0]^{(d+1)}[1]\,[0]^{k}[1]\,[0]^{(t)}\,[0]^{(d)}[1] \qquad (2a)$$

or by a second replacement pattern $$rp2 = [0]^{(d+1)}[1]\,[0]^{(d)}[1]\,[0]^{(k)}[1]\,[0]^{(t)} \qquad (2b)$$

Any other pattern within v will be bypassed into w.

Careful inspection of Eqq. (2), (2a) and (2b) shows the following:

the act of replacing increases the maximum runlength from k1 to $k > k1$.

the overall length of the forbidden pattern fp, $L_{fp} = (d+2) + (d+1)\cdot(r+1)$, equals that of each of the two replacement patterns rp1, rp2. Thus, the act of replacing does not alter the sequence length; with other words, the RMTR encoding is achieved without adding any redundancy.

The leading substring $[0]^{(d+1)}[1]$ of the forbidden pattern fp is actually being replaced by itself, which is equivalent to not being replaced at all. The inclusion of this leading substring in the forbidden pattern only serves as an indicator for marking or characterizing the start of a forbidden minimum transition run, of which it is not part.

Both replacement patterns, either in the middle or in the end, contain one instance each of a minimum run $[0]^{(d)}[1]$. So, other than what the Eqq. may suggest on first sight, what is actually being "replaced away" is not an (r+1)-fold repetition of the minimum run, but merely an r-fold repetition.

The number of "ones" in the forbidden pattern fp is r+2; that in the replacement patterns rp1, rp2 is 3, constant. Thus it depends on r whether the resulting code can be considered as parity preserving or not. In any case, choosing between the replacement patterns does not alter the parity.

Keeping in mind the subsequent NRZI modulation, and assuming without loss of generality that after the leading substring $[0]^{(d+1)}[1]$ of the replacement patterns a parity of "pit" or "plus" is assumed, the RDS will change by a contribution $c1 = -(k+1) + (t+d+1)$ when the first replacement pattern is used, whereas using the second replacement pattern will result in an RDS contribution $c2 = -(d+1) + (k+1) - t$, which is exactly the opposite of c1.

There is a special caveat that must be taken into account in the replacing, namely the case when the sequence of constrained tuples v contains a repetition of very many minimum length runs, $\rho \gg r$, so that actually more than one directly consecutive replacement is needed to fulfill the RMTR constraint. The replacement defined by Eqq. (2), (2a) and (2b) above covers this case only if the replacement encompasses the following:

In the case of t=0, after a replacement has been performed, searching for the next $[0]^{(d+1)}[1]$ pattern must start at the (d+1) last zeroes of the term $[0]^{(k)}[1]$ as it occurs in the output of the replacement regardless of which replacement pattern has been used.

In the case of t>0, after a replacement has been performed, searching for the next $[0]^{(d+1)}[1]$ pattern must start at the last zero of the term $[0]^{(t)}$ as it occurs in the output of the replacement, regardless of which replacement pattern has been used. The important thing to note is that, after having performed a replacement, searching for the next forbidden pattern must actually start at a position within the bitstring that has just been output.

The replacement defined by Eqq. (2), (2a) and (2b) above has another advantageous property, with respect to the runlengths of "0"s occurring in the sequence of RMTR encoded tuples w:

Internally within the replacement pattern, the first replacement pattern rp1 contains runs of length k and (t+d), and the second replacement pattern rp2 contains runs of length d and k. The prefix $[0]^{(d+1)}[1]$ can be disregarded for these considerations, because it is left unchanged by the replacement.

At the beginning and end of the replacement pattern, i.e. where the replacement pattern adjoins the preceding and subsequent bitstream parts, no new runlengths are being generated in case of the first replacement pattern rp1. Specifically, due to the "1" at the end of this replacement pattern, any subsequent zero-run in the bitstream is left unaltered.

In contrast to this, the second replacement pattern rp2 ends in $[0]^{(t)}$, i.e. a zero run of length t. But that run is not terminated by a "1", so its effective length remains undefined unless one looks at the replacement pattern and the subsequent bitstream in connection.

The subsequent bitstream, because of its origin from a dk-encoded stream after the forbidden pattern fp, will always start with a zero-run of a length s obeying $d \leq s \leq k1$, followed by a "1". Note that in cases where d=0, this zero-run may actually be non-existent. In any case, the zero-run of length t followed by the zero-run of length s combine into a resulting zero-run of length (t+s). In particular, with s being bound as mentioned above, the resulting runlength will actually be bound by $t+d \leq t+s \leq t+k1$.

In summary, as a consequence of the replacement, new zero runs are being generated having lengths of d, and any length between d+t and k1+t, inclusive. Together with the zero-runs staying unchanged in the bitstream, the RMTR coded bitstream will potentially have all runlengths from the interval [d,k1+t] and the singular runlength k.

Notably, in reverse, runs having lengths in between these, i.e. from k1+t+1 up to k−1, inclusive, will not be generated. Of course, for this property to materialise, k1+t+1≦k−1 must hold.

In the above described code configuration where certain runlengths from within the interval [d,k] are not being generated, while longer and shorter runs are, these non-occurring runlengths can be used for signalling purposes of any kind, in particular to convey synchronising information. It is known in d,k-encoding for band-limited channels to provide synchronisation information by splicing into the RLL coded bitstream, in regular intervals, a synchronisation pattern that comprises a zero run which deliberately violates the upper limitation k of the RLL code. With the encoding method according to the invention, synchronisation patterns comprising one of the non-occurring runlengths, i.e. a runlength from within a compact subset of the interval [d,k], can be spliced in instead.

Figure 2:
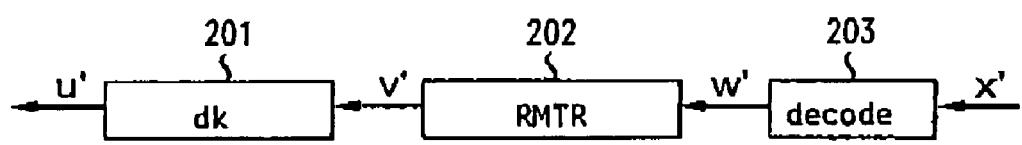
FIG. 2 shows a block diagram of a channel decoder according to the invention.

FIG. 2 shows a block diagram of an RMTR-obeying RLL-decoder according to the invention, which is the counterpart to the RMTR-obeying RLL-encoder shown in FIG. 1. The decoder has a conventional predecoder 203 for the inverse mapping and NRZI demodulation, and a conventional dk-decoder 201 obeying a runlength limitation of (d,k1). According to the invention, an RMTR-decoder 202, described in more detail below, is placed between the predecoder 203 and the dk-decoder 201.

Figure 5:
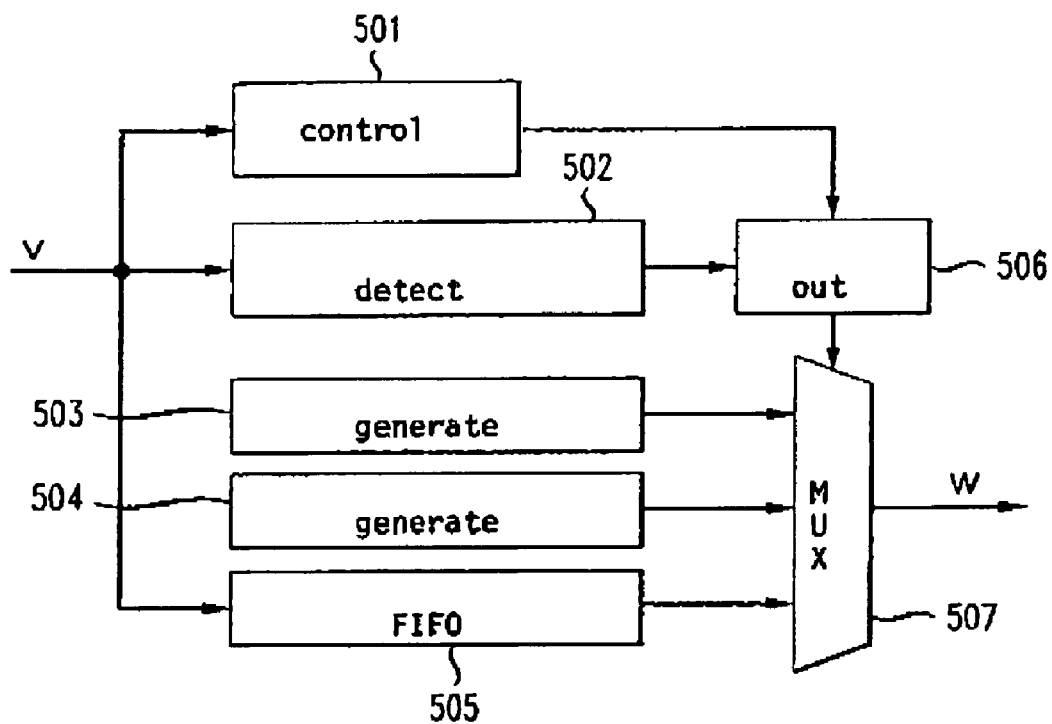
FIG. 5 shows an RMTR encoder according to the invention.

FIG. 5 shows a block diagram of an implementation of the above described RMTR-encoder 102 according to the invention. The sequence of constrained tuples v from the dk-encoder 101 is input to a DC-controller 501, to be described below, to a forbidden pattern detector 502 (further having an output block 506), and to a first in first out memory or FIFO 505. As long as the forbidden pattern detector 502 does not detect any instance of the forbidden pattern fp, the constrained tuples v as delayed via the FIFO 505 are being multiplexed 507 into the sequence of RMTR encoded tuples w. If the forbidden pattern detector 502 does detect an instance of the forbidden pattern fp, either the first replacement pattern rp1 according to Eq. (2a) from a first replacement pattern generator 503, or the second replacement pattern rp2 according to Eq. (2b) from a second replacement pattern generator 504 are being multiplexed 507 into the sequence of RMTR encoded tuples W.

For various reasons connected to signal regeneration on the storage readout side, it is important that the output signal w being written onto the medium is "DC free", with other words, that, at least on average, this signal contains as much of "pit" as of "space", or as much of "plus" as of "minus" in the magnetic case. As a criterion to measure this desirable property, the Running Digital Sum or RDS is used. In the domain of the symmetrically valued output values w∈{−1,+1}, the RDS corresponds to the time integral taken from some start time up to the current time. But the RDS can as well be derived before the NRZI precoder, i.e. in the domain of the dk-encoded constrained tuples v. There it amounts to sequentially using the runs of "0"s between the isolated "1"s to alternatively count up and down in an up-down-counter. In addition to the RDS itself, its variation is also used as a criterion whether a code is DC-free. This variation is often designated as Digital Sum Variation or DSV and defined as DSV=max(RDS)−min(RDS)+1.

By choosing between the first replacement pattern rp1 or the second replacement pattern rp2, DC-control or running digital sum RDS control can optionally be performed, as controlled by the DC-controller 501. One approach for DC controlling is to evaluate the running digital sum of the sequence of precoded tuples.

The sequence of RMTR encoded tuples w from the RMTR encoder 102 obeys runlength limitations (d,k) as well as the RMTR constraint r. As mentioned before, it is inherent in the method according to the invention, that the maximum runlength k valid within the sequence of RMTR encoded tuples w must be greater than the internal maximum runlength k1 of the dk-encoder 101. The parameter t constitutes a degree of freedom of the encoder design, limited only by the runlength limitations d, k1, k and the RMTR constraint r, as described in Eq. (1).

Figure 6:
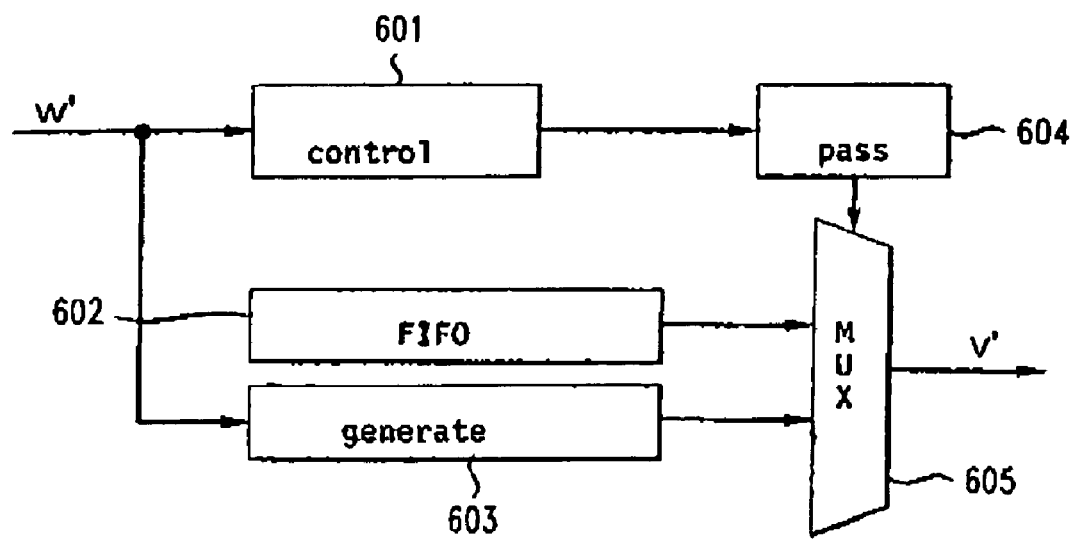
FIG. 6 shows an RMTR decoder according to the invention.

FIG. 6 shows a block diagram of an implementation of an RMTR-decoder 202 according to the invention, which generates 603 a sequence of dk decodable tuples v'. Advantageously, irrespective 602 of whether the encoding used the first replacement pattern rp1 according to Eq. (2a) or the second replacement pattern rp2 according to Eq. (2b), RMTR-decoding 601 is performed by replacing any occurrence of a predetermined trigger pattern $$tp = [1]\,[0]^{(k)}[1]\,[0]^{(t)} \qquad (3)$$

within the sequence of predecoded tuples w' by a predetermined decoded pattern $$dp = [1]\,[[0]^{(d)}[1]]^{(r+1)} \qquad (4)$$

Any other pattern within W' will be bypassed 604 unchanged into v' 605.

Figure 7:
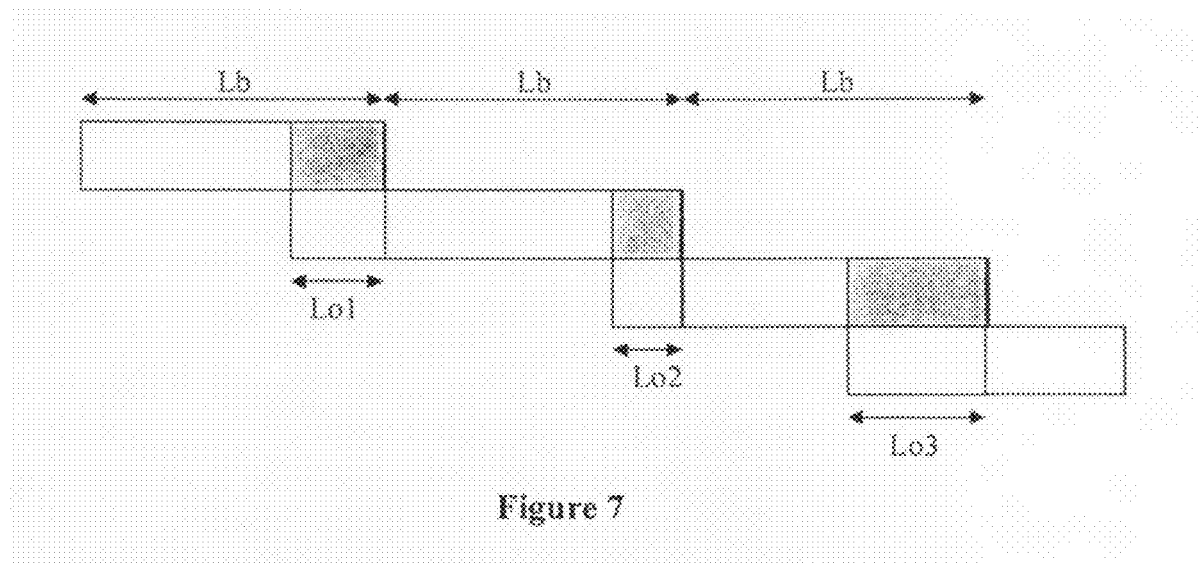
FIG. 7 illustrates block-by-block RMTR encoding according to the invention.

FIG. 7 illustrates block-by-block RMTR encoding, with a blocklength Lb, of a sequence of constrained tuples v according to the invention. Special precautions must be observed here, because the forbidden pattern fp according to Eq. (2), with its overall length of $L_{fp}=(d+2)+(d+1)\cdot(r+1)$, generally may appear anywhere within the bitstream, including in particular all those positions where it effectively crosses block boundaries. Therefore care has to be taken that no pattern is missed. This problem can be solved by using a variable overlap of length Lo at each junction between consecutive blocks. This means that the last Lo bits are not encoded within the current block, but within the next one. The individual value which the overlap length Lo will assume in any block, depends on whether and where exactly a partial forbidden pattern is being found at the end of the block. However, Lo is limited to a maximum value of $L_{o,max}=L_{fp}-1$, corresponding to the case that all but one of the bits of the forbidden pattern fp is contained at the end of a block, so that the very last bit thereof is found in the subsequent block. With other words, for testing the last $L_{o,max}$ bits of a block, the forbidden pattern detector 502 repetitively compares block tails starting at successive positions i.e. bitstreams of linearly decreasing length, with an accordingly shortened substring from the beginning of the forbidden pattern fp. Whenever this comparison fires, the end of the block is internally memorised and prepended as a carry-over to the bitstream of the subsequent block.

The Table lists examples of RMTR pattern encoding according to the invention for different RLL codes. In each of the examples, designated as "a" to "i" in the Table, the code parameter values are shown, followed by an example bitstream assumed to be taken from a sequence of constrained tuples v and exhibiting an instance of a sequence of short runs which violates the RMTR constraint r. Underneath that, designated as "1) w" because it is assumed to be taken from a sequence of RMTR encoded tuples w, a bit string is shown where the forbidden pattern fp has been replaced by the first replacement pattern rp1. Similarly, the table row designated as "2) w" shows the bitstream where the forbidden pattern fp has been replaced by the second replacement pattern rp2.

TABLE

| | |
|---|---|
| a | d = 0, k1 = 7, k = 8, r = 9, t = 0 |
| | v = [ . . . 0\|1\|1\|1\|1\|1\|1\|1\|1\|1\|1\|1\|1 . . . ] |
| | 1) w = [ . . . 0\|1\|0\|0\|0\|0\|0\|0\|0\|0\|1\|1 . . . ] |
| | 2) w = [ . . . 0\|1\|1\|0\|0\|0\|0\|0\|0\|0\|0\|1 . . . ] |
| b | d = 0, k1 = 7, k = 9, r = 10, t = 0 |
| | v = [ . . . 0\|1\|1\|1\|1\|1\|1\|1\|1\|1\|1\|1\|1 . . . ] |
| | 1) w = [ . . . 0\|1\|0\|0\|0\|0\|0\|0\|0\|0\|0\|1\|1 . . . ] |
| | 2) w = [ . . . 0\|1\|1\|0\|0\|0\|0\|0\|0\|0\|0\|0\|1 . . . ] |
| c | d = 0, k1 = 7, k = 8, r = 10, t = 1 |
| | v = [ . . . 0\|1\|1\|1\|1\|1\|1\|1\|1\|1\|1\|1\|1 . . . ] |
| | 1) w = [ . . . 0\|1\|0\|0\|0\|0\|0\|0\|0\|0\|1\|0\|1 . . . ] |
| | 2) w = [ . . . 0\|1\|1\|0\|0\|0\|0\|0\|0\|0\|0\|1\|0 . . . ] |
| d | d = 1, k1 = 7, k = 9, r = 5, t = 0 |
| | v = [ . . . 0 0 1\|0 1\|0 1\|0 1\|0 1\|0 1\|0 1 . . . ] |
| | 1) w = [ . . . 0 0 1 0 0\|0 0\|0 0\|0 0\|0 1\|0 1 . . . ] |
| | 2) w = [ . . . 0 0 1\|0 1\|0 0\|0 0\|0 0\|0 0\|0 1 . . . ] |
| e | d = 1, k1 = 7, k = 8, r = 5, t = 1 |
| | v = [ . . . 0 0 1\|0 1\|0 1\|0 1\|0 1\|0 1\|0 1 . . . ] |
| | 1) w = [ . . . 0 0 1 0 0\|0 0\|0 0\|0 0\|0 1\|0 0\|0 1 . . . ] |
| | 2) w = [ . . . 0 0 1\|0 1\|0 0\|0 0\|0 0\|0 0\|1 0 . . . ] |
| f | d = 2, k1 = 7, k = 11, r = 4, t = 0 |
| | v = [ . . . 0 0 0 1\|0 0 1\|0 0 1\|0 0 1\|0 0 1\|0 0 1 . . . ] |
| | 1) w = [ . . . 0 0 0 1\|0 0 0\|0 0 0\|0 0 0\|0 0 1\|0 0 1 . . . ] |
| | 2) w = [ . . . 0 0 0 1\|0 0 1\|0 0 0\|0 0 0\|0 0 0\|0 0 1 . . . ] |
| g | d = 2, k1 = 7, k = 10, r = 4, t = 1 |
| | v = [ . . . 0 0 0 1\|0 0 1\|0 0 1\|0 0 1\|0 0 1\|0 0 1 . . . ] |
| | 1) w = [ . . . 0 0 0 1\|0 0 0\|0 0 0\|0 0 0\|0 0 1 0\|0 0 1 . . . ] |
| | 2) w = [ . . . 0 0 0 1\|0 0 1\|0 0 0\|0 0 0\|0 0 0\|0\|1 0 . . . ] |
| h | d = 2, k1 = 7, k = 9, r = 4, t = 2 |
| | v = [ . . . 0 0 0 1\|0 0 1\|0 0 1\|0 0 1\|0 0 1\|0 0 1 . . . ] |
| | 1) w = [ . . . 0 0 0 1\|0 0 0\|0 0 0\|0 0 0\|0 0\|1 0 0\|0 0 1 . . . ] |
| | 2) w = [ . . . 0 0 0 1\|0 0 1\|0 0 0\|0 0 0\|0 0 0\|0\|1 0 0 . . . ] |
| i | d = 2, k1 = 7, k = 8, r = 3, t = 0 |
| | v = [ . . . 0 0 0 1\|0 0 1\|0 0 1\|0 0 1\|0 0 1 . . . ] |
| | 1) w = [ . . . 0 0 0 1\|0 0 0\|0 0 0\|0 0 0 1\|0 0 1 . . . ] |
| | 2) w = [ . . . 0 0 0 1\|0 0 1\|0 0 0\|0 0 0\|0 0 1 . . . ] |

Examples "a" to "c" assume a minimum runlength constraint d=0, hence the most critical case is a bitstream where the "1"s are immediately consecutive, so that the NRZI modulated signal would have alterations immediately following each other.

Correspondingly, examples "d" and "e" have d=1, and examples "f" to "i" have d=2.

The RMTR-encoder/decoder according to the invention adds the RMTR-constraint r to any existing RLL code which itself does not take care of the RMTR limitation. It does so without introducing any redundancy into the code. The underlying RLL code can therefore be kept more simple and easier to design. DC-control can be carried out through optional encoding. This increases the maximum RMTR length r by one.

Core of the invention is the encoding of r repeated minimum transition runs (RMTR) within a k1-constrained RLL coded sequence into runs of k>k1 consecutive zeros. If r and k are properly chosen, encoding can be done in a DC or RDS controllable way. The invention can be applied to any RLL code as a postencoding/predecoding step.

With other words, in a channel encoder comprising a dk-encoder stage 101 and a preceding stage 103, obeyance of a repeated minimum transition runlength constraint r is achieved because, between the dk-encoder 101 and the precoder 103, data are passed through an RMTR encoder 102 which replaces occurrences of a forbidden pattern fp by a current replacement pattern having the same length as the forbidden pattern fp. By appropriately selecting each current replacement pattern from a predefined set of two different replacement patterns rp1, rp2, DC-control is achieved for the encoder output. The corresponding decoder is described, which also employs pattern replacement.

What is claimed is:

1. A method of channel encoding binary data, the data contained in an input sequence of data tuples, to obey a lower runlength limit, a second upper runlength limit, and a repeated minimum transition runlength constraint, the method comprising steps of
encoding the input sequence into a sequence of constrained tuples using an RLL encoder,
generating from the sequence of constrained tuples a sequence of output tuples that obeys the repeated minimum transition runlength constraint by replacing any occurrences of a predefined forbidden pattern occurring in the sequence of constrained tuples by a current replacement pattern having the same length as the forbidden pattern, and
postencoding with NRZI modulation the sequence of output tuples into a sequence of precoded tuples to be used in the channel; wherein
encoding is done with an RLL encoder having the lower runlength limit and a first upper runlength limit smaller than the second upper runlength limit, and
in the generating step, current replacement patterns are being selected from a predefined set of two replacement patterns.

2. The method of claim 1, where the value range of the binary signal comprises a first binary value and a second binary value, where the forbidden pattern consists of $[0]^{(d+1)}$ $[1]$ $[[0]^{(d)}[1]]^{(r+1)}$, and where the predefined set of replacement patterns consists of a first replacement pattern consisting of $[0]^{(d+1)}[1]$ $[0]^{(k)}[1]$ $[0]^{(1)}$ $[0]^{(d)}[1]$ and a second replacement pattern consisting of $[0]^{(d+1)}[1]$ $[0]^{(d)}[1]$ $[0]^{(k)}[1]$ $[0]^{(1)}$; the notation $[x]^{(y)}$ indicating a y-fold serial repetition of a binary value or string of binary values x, and t being a predefined parameter obeying $0 \leq 2t \leq (d+1) \cdot r - 1 - k1$.

3. The method of claim 2, wherein the second upper runlength limit, the first upper runlength limit- and the predefined parameter are chosen such that the sum of the first upper runlength limit and the predefined parameter is less than or equal to the second upper runlength limit minus two, and where sync patterns having a size from the first upper runlength limit plus the predefined parameter plus one up to the second upper runlength limit minus one bits are inserted into the sequence of precoded tuples.

4. The method of claim 1, wherein
a running digital sum is calculated, and
the selection of the current replacement pattern from the set of replacement patterns is done so that the running digital sum stays as close as possible near zero.

5. A method of channel decoding binary data which obey a lower runlength limit, a second upper runlength limit, and a repeated minimum transition runlength constraint, the method comprising steps of
generating, from a sequence of readout tuples read out from a channel, a sequence of predecoded tuples by predecoding with NRZI demodulation,
RMTR decoding the sequence of predecoded tuples into a sequence of dk-decodable tuples by replacing any occurrences of a trigger pattern by a decoded pattern-having the same length as the trigger pattern,
dk-decoding the sequence of dk-decodable tuples into a sequence of RLL decoded tuples;
wherein dk-decoding is done with a dk-decoder having the lower runlength limit and a first upper runlength limit-smaller than the second upper runlength limit.

6. The method of claim 5, where the value range of the binary signal comprises a first binary value and a second binary value, where the trigger pattern consists of $[1][0]^{(k)}[1][0]^{(1)}$, and where the decoded pattern consists of $[1][[0]^{(d)}[1]]^{(r+1)}$; the notation $[x]^{(y)}$ indicating a y-fold serial repetition of a binary value or string of binary values x, and t being a predefined parameter obeying $0 \leq 2t \leq (d+1) \cdot r - 1 - k1$.

7. An apparatus for channel encoding binary data to obey a lower runlength limit, a second upper runlength limit, and a repeated minimum transition runlength constraint, the apparatus having a dk-encoder- with a lower runlength limit and a precoder performing NRZI modulation, where between the dk-encoder and the precoder, data are passed through an RMTR encoder-performing replacement of forbidden patterns by current replacement patterns having the same length as the forbidden pattern;

wherein the dk-encoder has a first upper runlength limit smaller than the second upper runlength limit; and the current replacement patterns are selected from a set of two predefined replacement patterns.

8. An apparatus for channel decoding binary data which obey a lower runlength limit, a second upper runlength limit, and a repeated minimum transition runlength constraint, the apparatus having a predecoder- for NRZI demodulation, connected to an RMTR decoder performing replacement of a trigger pattern by a decoded pattern having the same length as the trigger pattern, the latter connected to a dk-decoder with a lower runlength limit;

wherein the dk-decoder has a first upper runlength limit smaller than the second upper runlength limit.

* * * * *